United States Patent [19]

Barcella

[11] Patent Number: 5,715,204
[45] Date of Patent: Feb. 3, 1998

[54] SENSE AMPLIFIER WITH HYSTERESIS

[75] Inventor: Antonio Barcella, Trescore Balneario, Italy

[73] Assignee: SGS-Thomson Microelectronics, S.r.l., Agrate Brianza, Italy

[21] Appl. No.: 432,838

[22] Filed: May 2, 1995

[30] Foreign Application Priority Data

May 3, 1994 [EP] European Pat. Off. ............. 94830209

[51] Int. Cl.$^6$ ......................................................... G11C 7/02
[52] U.S. Cl. ............................................. 365/208; 365/207
[58] Field of Search .................................... 365/205, 207, 365/208, 189.07; 327/54, 55, 66, 87

[56] References Cited

U.S. PATENT DOCUMENTS

| | | | |
|---|---|---|---|
| 5,206,552 | 4/1993 | Iwashita | 327/54 |
| 5,289,415 | 2/1994 | DiMarco | 365/208 |
| 5,446,396 | 8/1995 | Brehmer | 327/66 |

FOREIGN PATENT DOCUMENTS 0594305  9/1993  European Pat. Off. .

OTHER PUBLICATIONS

"CMOS Differential Amplifier with Wide Hysteresis" IBM Tech. Disc. Bulletin, vol. 30, No. 11, Apr. '88, pp. 368–369.
"Design of GaAs Operational Amplifiers for Analog Sampled Data Applications" IEEE Transactions on Circuits and Systems, vol. 37, No. 7, Jul. '90, pp. 922–935.

*Primary Examiner*—A. Zarabian
*Attorney, Agent, or Firm*—Robert Groover; Betty Formby; Matthew Anderson

[57] ABSTRACT

The differential input stage of a sense amplifier is provided with a positive feedback for introducing a predefinable hysteresis that will prevent spurious transitions of the output of the sense amplifier, enhancing noise immunity. The positive feedback is realized by employing an inverting amplifying stage, which will introduce an hysteresis on one of the two switching phases. The thresholds of the sense amplifier may be made symmetric by modifying the area ratio of the load transistors.

47 Claims, 5 Drawing Sheets

SENSE AMPLIFIER WITH HYSTERESIS

CROSS-REFERENCE TO RELATED APPLICATION

This application claims priority from EP 94830209.6, filed May 3, 1994, which is hereby incorporated by reference. However, the content of the present application is not necessarily identical to that of the priority application.

BACKGROUND AND SUMMARY OF THE INVENTION

The present invention relates generally to read circuits of memory devices, and in particular to a read comparator (differential sense amplifier) having improved noise immunity which is particularly suited for redundance memory systems and in presence of relatively large capacitances of bitlines and of redundance columns.

During a bitline precharging phase that precedes the sensing phase and the read phase proper during which a logic datum read from a memory cell is produced on an output, the bitlines and the input nodes of the read comparator (typically a differential amplifier) are properly equalized. Notwithstanding this, in the presence of bitlines with a large capacitance and of redundant columns, where they exist, the input nodes of the sense amplifier and reading may be subject to oscillations, and therefore even relatively small differences of potential may be sufficient to cause spurious transitions on the output of the sense amplifier. These phenomena cause a lengthening of the time necessary to ensure that a definitive stabilization of the output datum of the read circuitry has occurred.

It is therefore a main object of the present invention to provide an improved sense amplifier having means for ensuring an enhanced noise immunity, so as to curb or exclude the occurrence of spurious output transitions.

Basically, the invention rests on the implementation of a predefinable hysteresis in the operating characteristics of the sense amplifier, such as to ensure that its output may undergo a transition only in presence of a sufficiently ample separation of the potentials of its input nodes of differential stage, thus ensuring an enhanced immunity to disturbances.

According to an aspect of the invention, this important result is obtained by implementing a positive feedback during a certain switching phase of the differential sense amplifier. Such a positive feedback is realized by an inverting amplifying stage which may be formed by a single transistor, functionally connected between an output node of the differential input stage and an intermediate node thereof, as will be described more in detail further on in this description.

The amplitude of the hysteresis band that is introduced may be easily set by suitably dimensioning the feedback amplifier, that is the size and characteristics of the feedback transistor. In view of the fact that the system is such as to introduce a hysteresis on a certain switching phase of the differential input stage (for example during the phase of switching its output from a high state to a low state), the necessary equalization of the input nodes of the sense amplifier (equalization of the levels or of the switching thresholds) may be re-established by realizing the dynamic load devices of the transistors pair of the differential input stage, with an appropriate ratio between each other areas.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1A:
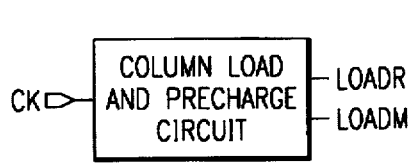
FIG. 1B schematically shows a memory read circuit of a memory device employing a sense amplifier or reading comparator provided with means capable of introducing a predefined hysteresis, according to the present invention, and FIG. 1A schematically shows a column load used with the circuit of FIG. 1B.
Figure 1B:
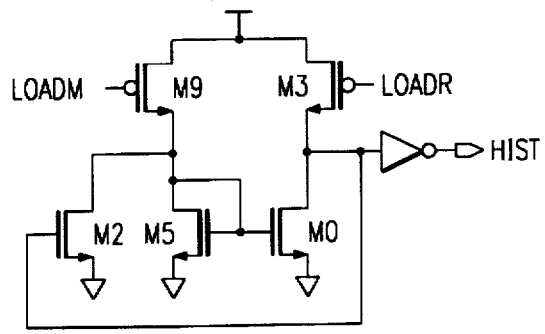

The numerous innovative teachings of the present application will be described with particular reference to the presently preferred embodiment (by way of example, and not of limitation), in which:

By referring to the diagram of FIGS. 1A and 1B, a memory reading circuitry is typically composed of clocked selection, precharge and equalization circuits (shown as a whole in the form of a circuit block in FIG. 1A) and by a discriminating and reading comparator (shown in FIG. 1B). The comparator is composed essentially of a differential stage, which may or may not be provided with an output logic buffer T1. The two outputs loadr and loadm of the selection, precharge and equalization circuitry, constitute the input nodes on a differential input stage of the reading comparator, which is commonly composed of a differential input pair of transistors M9 and M3 and a pair of dynamic load transistors M5 and M8, forming a current mirror. (It does not matter which line, loadm or loadr, provides the memory cell signal and which line provides the reference cell signal.)

An inverting stage I1 may be employed as an output logic buffer.

In the depicted example, the input transistors M9 and M3 are p-channel MOS transistors, having their respective sources connected in common and to a supply node, while their respective loads M5 and M8 are n-channel MOS transistors, preferably "natural" transistors (having a particularly low threshold).

According to a basic aspect of the invention, an inverting amplifying stage, which in the depicted example is formed by a single transistor M2, is employed for introducing a positive feedback during a switching phase of the comparator. In the shown example, the switching phase is from a high to a low state of the output of the differential stage. The feedback transistor M2 is preferably a natural, n-channel, MOS transistor, as shown.

In the example shown (if the output of the differential stage is high), it is necessary that the transistor M8 be turned on for the output level to switch from high to low. This may occur if the potential present on the gate potential of the M8 transistor rises above the turn-on threshold value of the M8 transistor.

On the other hand, the gate voltage of M8 coincides with the voltage drop across the diode (diode connected transistor) M5, which constitutes the dynamic load of the other transistor M9 of the differential input pair.

Due to the fact that when the state of the output of the differential stage is high, the positive feedback transistor M2 is conducting, the transistor M9 must reach a more enhanced state of conduction before being capable of forcing a current sufficient to cause the turn-on of the M8 transistor.

In practice, this means having introduced an hysteresis in the switching phase from a high to a low state of the output of the differential input stage of the reading comparator.

The amplitude of the introduced hysteresis may be predefined by appropriately dimensioning the feedback transistor M2. With the dimensions shown in the circuit diagram of FIG. 1B, the hysteresis that is introduced is of about 800 mV. Dimensions are indicated in a conventional way by the pair of values L/W, expressed in micrometers ($\mu$). The size of the feedback transistor $M_2$ may be e.g. $W_{M2}=\frac{1}{2}(W_{M8}-W_{M5}) \times W_{M8}/W_{M5}$, or may be empirically optimized. The feedback transistor M2 would preferably have the same threshold voltage as the load transistors M5 and M8.

As a consequence of the introduction of a hysteresis in one switching phase (from high to low in the shown example) of the output of the differential input stage of the reading comparator, the operating point of the comparator may be re-equalized by modifying the area ratio between the two dynamic load elements (transistors) M5 and M8, as shown in the diagram of FIGS. 1A and 1B.

Figure 2:
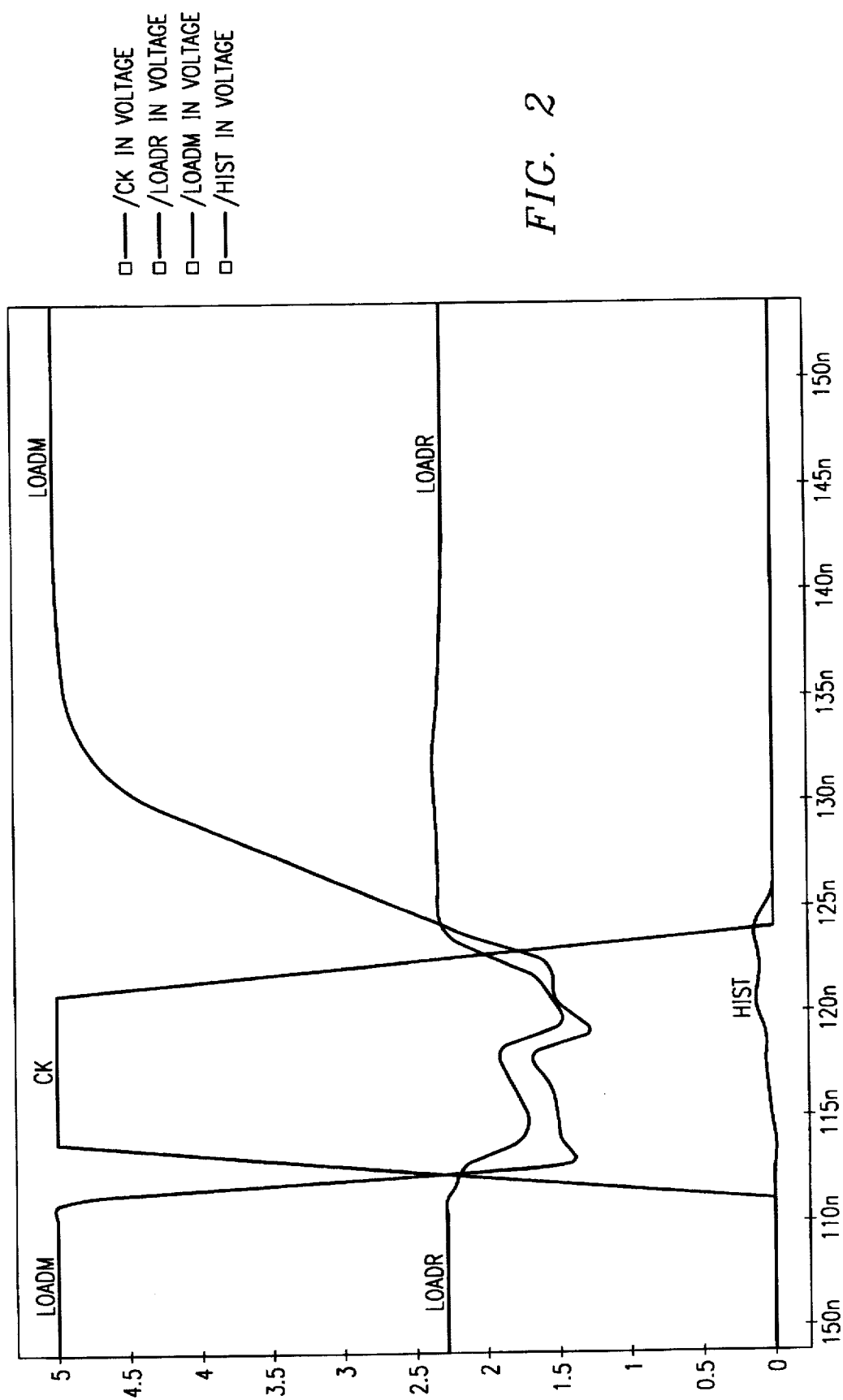
FIG. 2 shows simulation diagrams of the circuit of FIG. 1A.
Figure 3:
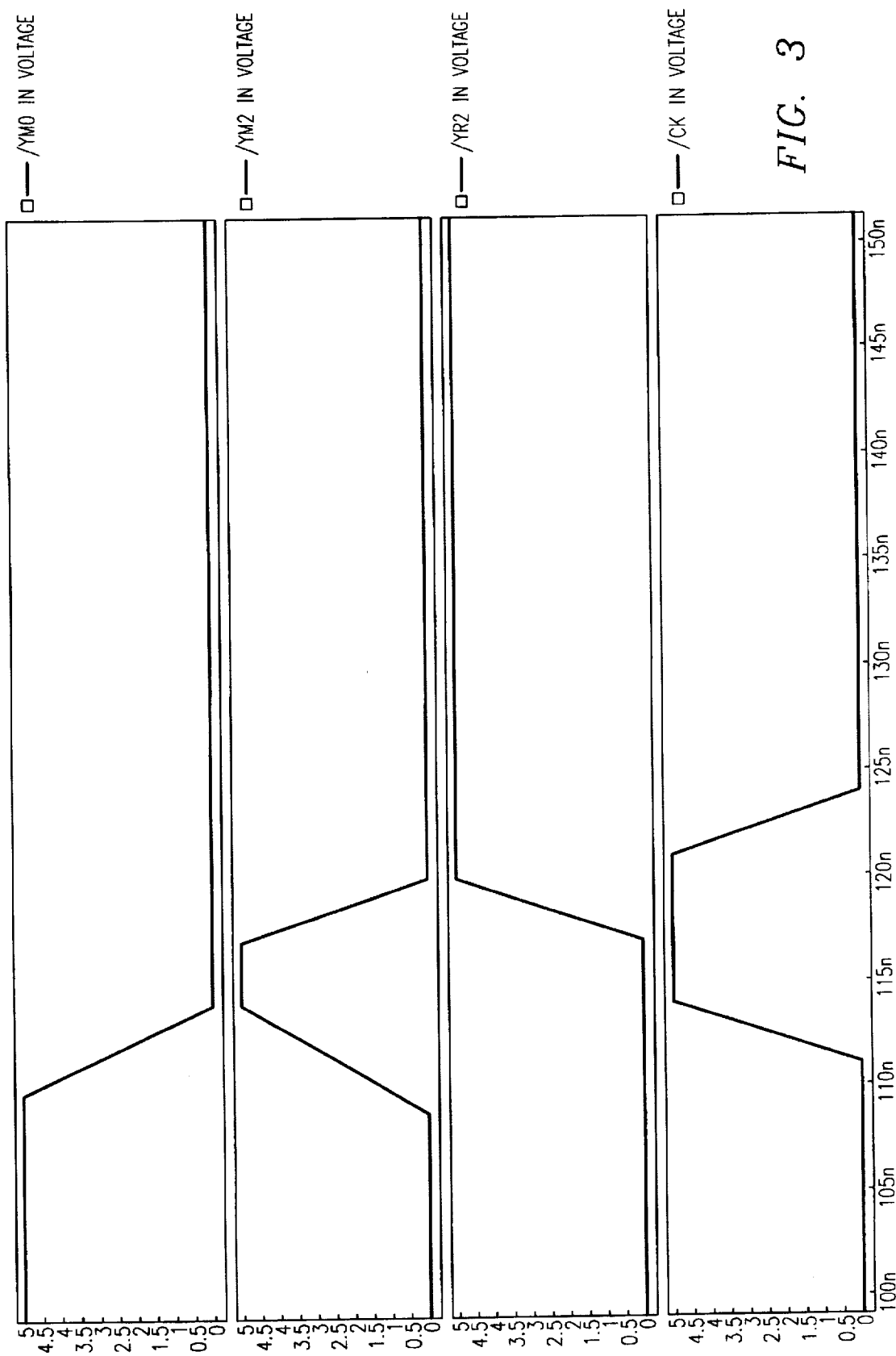
FIG. 3 shows the timing signals of the circuit.

The effect of the positive feedback introduced by the inverting stage M2, may be clearly observed in the simulation diagrams of the sense amplifier shown in FIG. 2, according to the timing signals shown in FIG. 3.

A possible timing scheme of the signals, which may be observed from the diagrams of FIG. 3, would be the following:

ym0: selection of the preceding column;
ym2: selection of a column;
yr2: selection of redundance column;
ck: precharge-equalization signal.

By observing the simulation diagrams of FIG. 2, it may be observed that, during switching, the redundance cell is selected for few nanoseconds, however no spurious switching of the output (hist) occurs.

Figure 4:
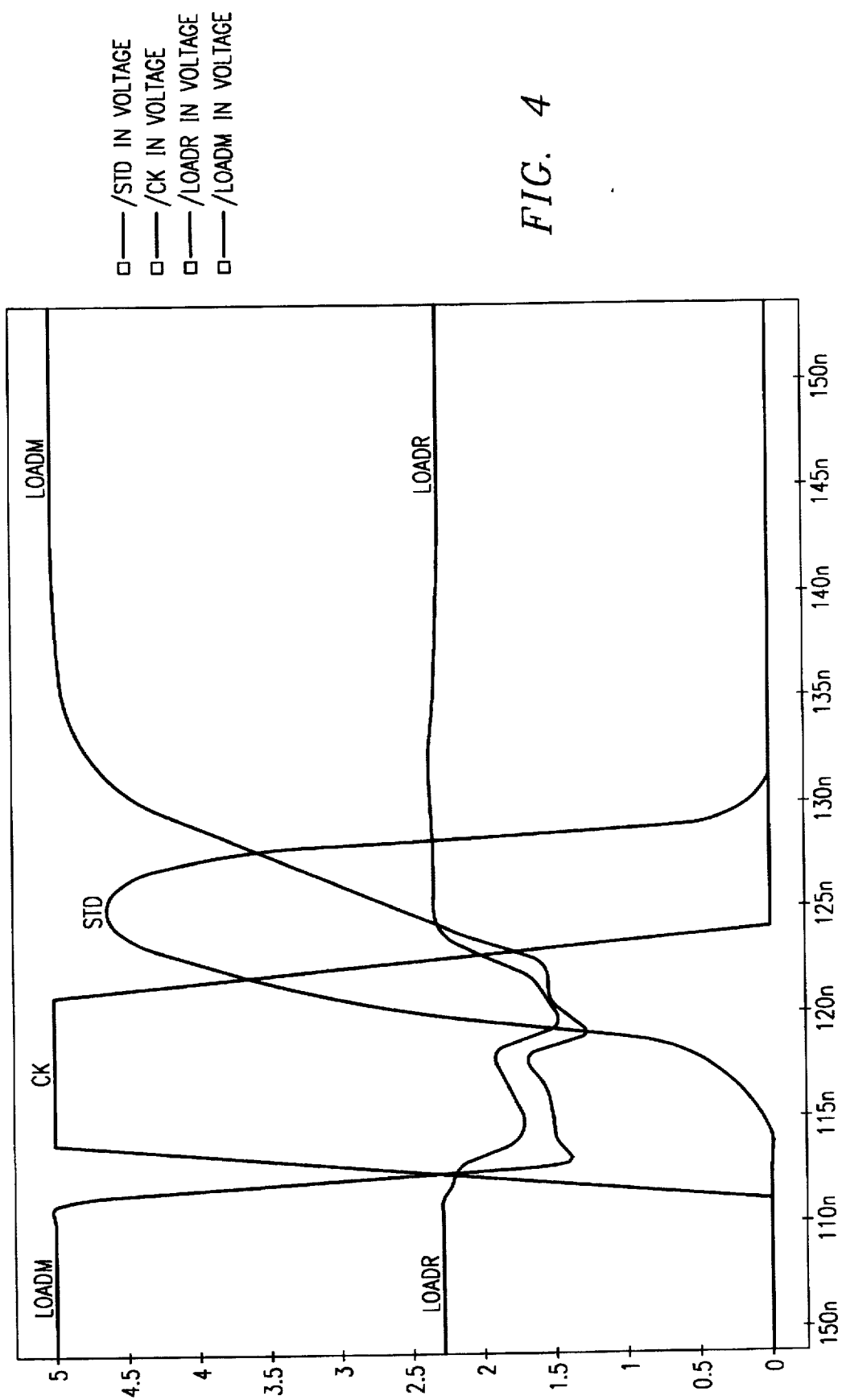
FIG. 4 shows simulation diagrams of a comparable circuit made according to the prior art, for comparison purposes.

Conversely, in the case of a reading comparator made according to the prior art and substantially without the feedback stage M2, the same timing scheme produces a circuit behavior as depicted in the diagrams of FIG. 4. As may be observed, the inversion of the input nodes that may occur during a precharge, produces a spurious switching of the output, which by contrast is totally absent in the case of a similar circuit, modified according to the present invention by introducing an hysteresis. (In the simulation of FIG. 4, the circuit is identical to that of FIG. 1, except that the feedback transistor is deleted and both NMOS loads have the same size, equal to that of the larger load transistor in FIG. 1. Note that the voltage signals of the loadm and loadr lines are identical in FIGS. 2 and 4; the advantage of the circuit of FIG. 1 is that the output HIST is not perturbed by this noise.)

Figure 5:
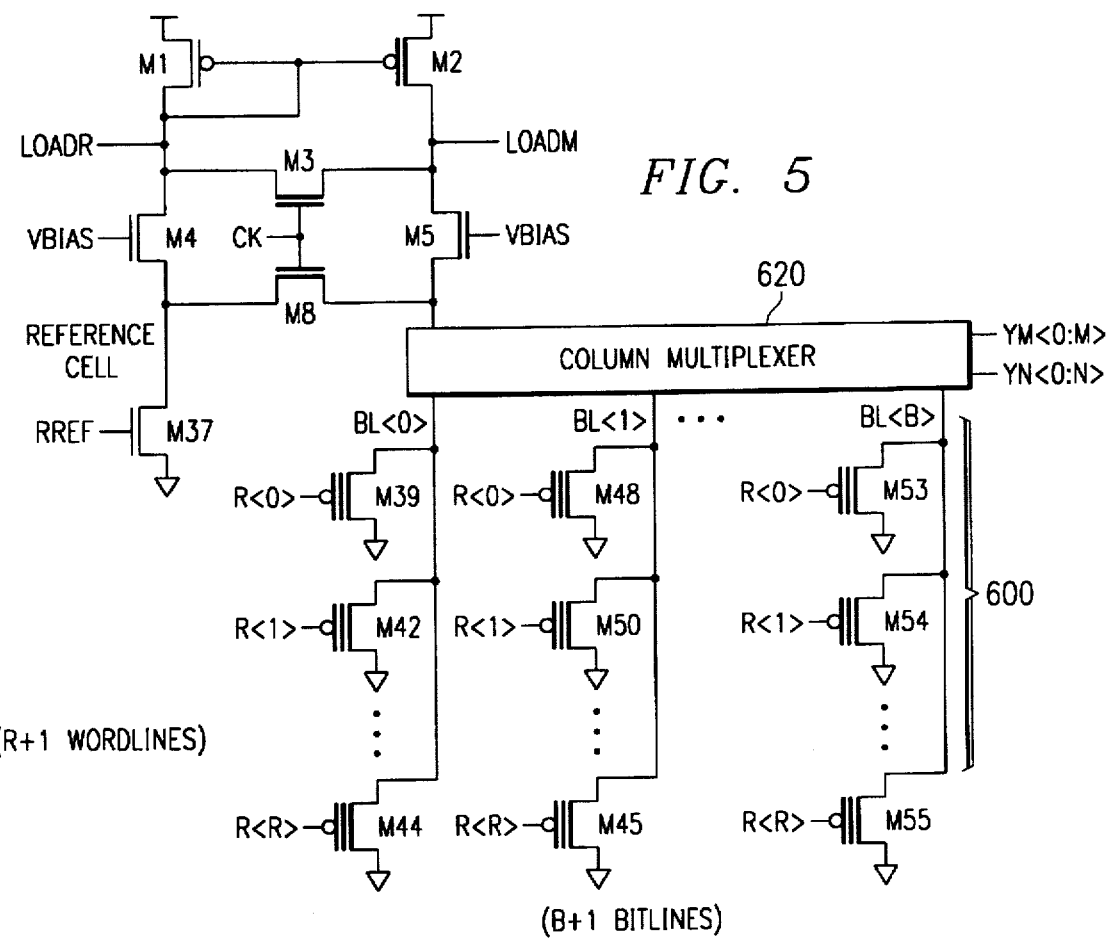
FIG. 5 shows a specific sample implementation of the column load of FIG. 1B.

FIG. 5 shows a specific sample implementation of the column load of FIG. 1B. Note that cascode loads are interposed in the two signal paths, and that two equalizing transistors are used to balance the bitline potentials before sensing. A reference cell is gated by a constant potential, and the resulting current is mirrored over to provide a current bias on the selected column. Nodes loadm and loadr provide differential outputs which are used as described above.

Figure 6:
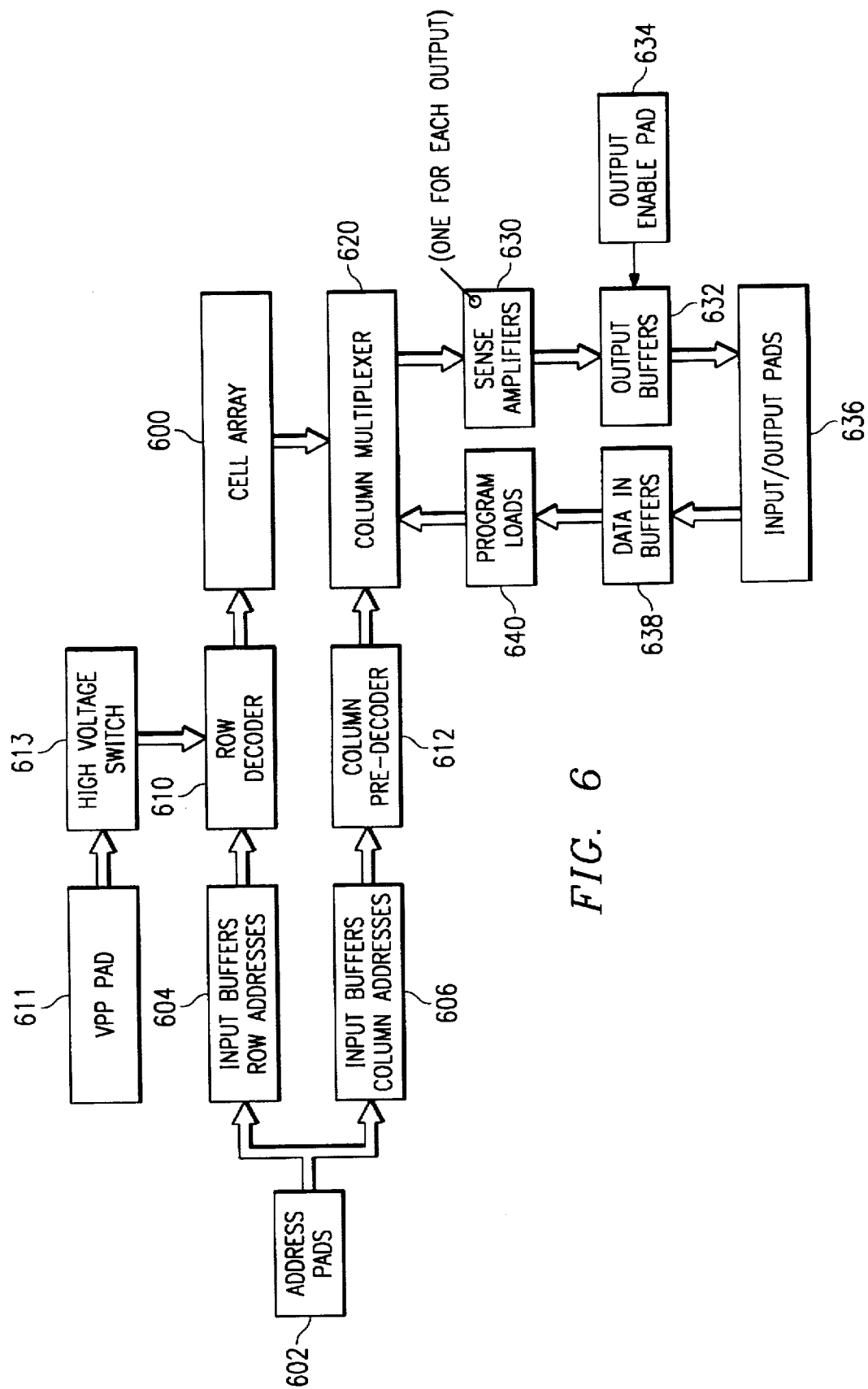
FIG. 6 shows an example of a complete memory chip including the circuit of FIG. 1A.

FIG. 6 shows an example of a complete EPROM memory chip including the circuit of FIG. 1A. The input addresses received on address pads 602 are buffered in column address buffers 606 and row address buffers 604, and applied to column predecoder circuitry 612 and row decoder circuitry 610.

The row decoder circuitry 610 operates conventionally to drive a selected word line, to access one row of the cell array 600. The row decoder circuitry 610 can also receive high voltages from the Vpp pad 611, through a high-voltage switch 613, to drive a selected word line with a high voltage for programmation.

The column predecoder circuitry 612 drives a column multiplexer 620, which connects one or more selected columns for data access. Data read from the one or more selected columns is amplified by sense amplifiers 630 (one for each output), which are followed by corresponding output buffers 632 which (when enabled by a signal on the output enable pad 634) send data through input/output pads 636. A corresponding number of data-in buffers 638 and programmation circuits 640 provide data transfer during write operation. The hysteretic circuit as described above is preferably incorporated in sense amplifier 630, but can alternatively be inserted before the multiplexer 620.

It is evident that the circuit of the invention may be realized in different ways, for example: the amplifying feedback stage M2 may also be implemented by employing an amplifier. The configuration of the comparator may be different from the one depicted, for example by inverting the conductivity type of the transistors used, and so forth.

According to a disclosed class of innovative embodiments, there is provided: A memory sense amplifier comprising: a pair of input transistors, each being connected to receive one side of a differential memory signal on a respective control terminal thereof; said input transistors having respective sources thereof operatively connected to a first power supply connection; a pair of load transistors, having respective sources thereof connected to a second power supply connection, said load transistors having control terminals thereof connected together and operatively connected to a drain terminal of a first one of said input transistors; and a feedback transistor, having the same conductivity type as said load transistors, and having a source terminal thereof connected to said second power supply connection, and having a drain terminal thereof connected to said drain terminal of said first input transistor, and having a control terminal thereof operatively connected to a terminal of said second input transistor which is also operatively connected to provide an output signal.

According to another disclosed class of innovative embodiments, there is provided: A memory sense amplifier comprising: a pair of input transistors, each being connected to receive one side of a differential memory signal on a respective control terminal thereof; said input transistors having respective sources thereof operatively connected to a first power supply connection; a pair of load transistors, having respective sources thereof connected to a second power supply connection, said load transistors having control terminals thereof connected together and operatively connected to a drain terminal of a first one of said input transistors; and a feedback transistor, having the same conductivity type as said load transistors, and having a source terminal thereof connected to said second power supply connection, and having a drain terminal thereof connected to said drain terminal of said first input transistor, and having a control terminal thereof operatively connected to a terminal of said second input transistor which is operatively connected to provide an output signal; and a pair of load elements, each being connected to pull one side of said differential memory signal toward said first power supply connection.

According to another disclosed class of innovative embodiments, there is provided: A memory sense amplifier comprising: a pair of input transistors, each being connected to receive one side of a differential memory signal on a respective control terminal thereof; said input transistors having respective sources thereof connected to a first power supply connection; a pair of load transistors, having respective sources thereof connected to a second power supply connection, said load transistors having control terminals thereof connected together and operatively connected to a drain terminal of a first one of said input transistors; and a feedback transistor, having the same conductivity type as said load transistors, and having a source terminal thereof connected to said second power supply connection, and having a drain terminal thereof connected to said drain terminal of said first input transistor, and having a control terminal thereof operatively connected to a terminal of said second input transistor which is operatively connected to provide an output signal; a first one of said input transistors being connected in series with a first one of said load transistors to form a first series connection from said first power supply connection to said second power supply connection, and a second one of said input transistors being connected in series with a second one of said load transistors to form a second series connection from said first power supply connection to said second power supply connection; and wherein no other positive feedback into either of said input transistors. A sense amplifier, characterized by having a feedback transistor directly connected, with no intervening stages, to provide a certain predefined hysteresis.

According to another disclosed class of innovative embodiments, there is provided: A sense amplifier, comprising: an input differential stage comprising positive feedback means active during a switching phase, an input pair of transistors of a first type of conductivity, and a second pair of load transistors of a second type of conductivity, each respective one of said input pair being connected in a current mirror configuration with a corresponding one of said pair of load transistors and having an area ratio between each other such as to make the switching thresholds of the sense amplifier symmetric, notwithstanding the hysteresis introduced by said positive feedback means in one of the two switching phases; and a feedback transistor directly connected, with no intervening stages, to provide a certain predefined hysteresis; wherein said positive feedback means during a switching phase are constituted by an amplifying inverting stage having an input connected to an output node of said input differential stage and an output coinciding with a load node of one transistor of said input pair.

According to another disclosed class of innovative embodiments, there is provided: A method for performing sense amplification in a memory, comprising the steps of: providing differential sensing inputs to the gates of first and second matched input transistors, said first input transistor being connected to provide a first output signal at a current-carrying terminal thereof; loading said first input transistor with a first load transistor which is connected in series therewith, and loading said second input transistor both with a second load transistor which is connected in series therewith and also with a feedback transistor which is directly connected to be driven by said first output signal; and amplifying said first output signal to drive an output terminal.

According to another disclosed class of innovative embodiments, there is provided: An integrated circuit memory, comprising: an array of memory cells arranged in rows and columns; row selection circuitry, connected to activate a selected row of memory cells; one or more load elements connected to provide an electrical load to data outputs from one or more selected cells in a selected row of memory cells; and at least one sense amplifier comprising: a pair of input transistors, each being connected to receive one side of a differential memory signal on a respective control terminal thereof; said input transistors having respective sources thereof operatively connected to a first power supply connection; a pair of load transistors, having respective sources thereof connected to a second power supply connection, said load transistors having control terminals thereof connected together and operatively connected to a drain terminal of a first one of said input transistors; and a feedback transistor, having the same conductivity type as said load transistors, and having a source terminal thereof connected to said second power supply connection, and having a drain terminal thereof connected to said drain terminal of said first input transistor, and having a control terminal thereof operatively connected to a terminal of said second input transistor which is also operatively connected to provide an output signal.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For another example, the disclosed inventions can be applied to the dual circuit to FIG. 1, i.e. with cross-coupled PMOS loads. (This choice is dictated not only by the conductivity type of the memory cells, which usually have NMOS drivers, but also by the number of stages used in the sensing circuit.)

For another example, the disclosed inventions can be applied not only to EPROMs, but also to SRAMs and flash memories.

What is claimed is:

1. A memory sense amplifier comprising:

a pair of input transistors, each being connected to receive one side of a differential memory signal on a respective control terminal thereof;

said input transistors having respective sources thereof operatively connected to a first power supply connection;

a pair of load transistors, having respective sources thereof connected to a second power supply connection, said load transistors having control terminals thereof connected together and operatively connected to a drain terminal of a first one of said input transistors; and a feedback transistor, having a same conductivity type as said load transistors, and having a source terminal thereof connected to said second power supply connection, and having a drain terminal thereof connected to said drain terminal of said first one of said input transistors, which is not directly coupled to said first and second power supply and having a control terminal thereof operatively connected to a terminal of a second one of said input transistors which is also operatively connected to provide an output signal;

whereby the occurrence of spurious output transitions is reduced.

2. The sense amplifier of claim 1, wherein said input transistors are matched.

3. The sense amplifier of claim 1, wherein said input transistors are P-channel field-effect transistors.

4. The sense amplifier of claim 1, wherein said first power supply connection carries a positive power supply voltage, and said second power supply connection is a ground connection.

5. The sense amplifier of claim 1, wherein said load transistors are natural transistors.

6. The sense amplifier of claim 1, wherein said input transistors have mutually equal sizes, and said load transistors do not have mutually equal sizes.

7. The sense amplifier of claim 1, wherein said feedback transistor has the same conductivity type and threshold voltage as said load transistors.

8. The sense amplifier of claim 1, wherein said feedback transistor is connected in parallel with a first one of said load transistors, and is connected to receive a control voltage taken directly from the drain of a second one of said load transistors.

9. The sense amplifier of claim 1, wherein said feedback transistor is connected in parallel with a first one of said load transistors, and is smaller than said first load transistor, and said first load transistor is smaller than the other of said load transistors.

10. A memory sense amplifier comprising:

a pair of input transistors, each being connected to receive one side of a differential memory signal on a respective control terminal thereof;

said input transistors having respective sources thereof operatively connected to a first power supply connection;

a pair of load transistors, having respective sources thereof connected to a second power supply connection, said load transistors having control terminals thereof connected together and operatively connected to a drain terminal of a first one of said input transistors; and a feedback transistor, having same conductivity type as said load transistors, and having a source terminal thereof connected to said second power supply connection, and having a drain terminal thereof connected to said drain terminal of said first one of said input transistors which is not directly coupled to said first and said second power supply, and having a control terminal thereof operatively connected to a terminal of a second one of said input transistors which is operatively connected to provide an output signal; and a pair of load elements, each being connected to pull one side of said differential memory signal toward said first power supply connection.

11. The sense amplifier of claim 10, wherein said input transistors are matched.

12. The sense amplifier of claim 10, wherein said input transistors are P-channel field-effect transistors.

13. The sense amplifier of claim 10, wherein said first power supply connection carries a positive power supply voltage, and said second power supply connection is a ground connection.

14. The sense amplifier of claim 10, wherein said load transistors are natural transistors.

15. The sense amplifier of claim 10, wherein said input transistors have mutually equal sizes, and said load transistors do not have mutually equal sizes.

16. The sense amplifier of claim 10, wherein said feedback transistor has the same conductivity type and threshold voltage as said load transistors.

17. The sense amplifier of claim 10, wherein said feedback transistor is connected in parallel with a first one of said load transistors, and is connected to receive a control voltage taken directly from the drain of a second one of said load transistors.

18. The sense amplifier of claim 10, wherein said feedback transistor is connected in parallel with a first one of said load transistors, and is smaller than said first load transistor, and said first load transistor is smaller than the other of said load transistors.

19. A memory sense amplifier comprising:

a pair of input transistors, each being connected to receive one side of a differential memory signal on a respective control terminal thereof;

said input transistors having respective sources thereof connected to a first power supply connection;

a pair of load transistors, having respective sources thereof connected to a second power supply connection, said load transistors having control terminals thereof connected together and operatively connected to a drain terminal of a first one of said input transistors; and a feedback transistor, having same conductivity type as said load transistors, and having a source terminal thereof connected to said second power supply connection, and having a drain terminal thereof connected to said drain terminal of said first one of said input transistors which is not directly coupled to said first and said second power supply, and having a control terminal thereof operatively connected to a terminal of a second one of said input transistors which is operatively connected to provide an output signal;

said first one of said input transistors being connected in series with a first one of said load transistors to form a first series connection from said first power supply connection to said second power supply connection, and said second one of said input transistors being connected in series with a second one of said load transistors to form a second series connection from said first power supply connection to said second power supply connection; and wherein no other positive feedback enters into either of said input transistors.

20. The sense amplifier of claim 19, wherein said input transistors are matched.

21. The sense amplifier of claim 19, wherein said input transistors are P-channel field-effect transistors.

22. The sense amplifier of claim 19, wherein said first power supply connection carries a positive power supply voltage, and said second power supply connection is a ground connection.

23. The sense amplifier of claim 19, wherein said load transistors are natural transistors.

24. The sense amplifier of claim 19, wherein said input transistors have mutually equal sizes, and said load transistors do not have mutually equal sizes.

25. The sense amplifier of claim 19, wherein said feedback transistor has the same conductivity type and threshold voltage as said load transistors.

26. The sense amplifier of claim 19, wherein said feedback transistor is connected in parallel with a first one of said load transistors, and is connected to receive a control voltage taken directly from the drain of a second one of said load transistors.

27. The sense amplifier of claim 19, wherein said feedback transistor is connected in parallel with a first one of said load transistors, and is smaller than said first load transistor, and said first load transistor is smaller than the other of said load transistors.

28. An integrated circuit memory, comprising:
an array of memory cells arranged in rows and columns;
row selection circuitry, connected to activate a selected row of memory cells;
one or more load elements connected to provide an electrical load to data outputs from one or more selected cells in a selected row of memory cells; and
at least one sense amplifier comprising:
a pair of input transistors, each being connected to receive one side of a differential memory signal on a respective control terminal thereof;
said input transistors having respective sources thereof operatively connected to a first power supply connection;
a pair of load transistors, having respective sources thereof connected to a second power supply connection, said load transistors having control terminals thereof connected together and operatively connected to a drain terminal of a first one of said input transistors; and
a feedback transistor, having same conductivity type as said load transistors, and having a source terminal thereof connected to said second power supply connection, and having a drain terminal thereof connected to said drain terminal of said first one of said input transistors which is not directly coupled to said first and said second power supply, and having a control terminal thereof operatively connected to a terminal of a second one of said input transistors which is also operatively connected to provide an output signal.

29. The memory of claim 28, wherein said input transistors are matched.

30. The memory of claim 28, wherein said memory cells are SRAM cells.

31. The memory of claim 28, wherein said memory cells are floating-gate memory cells.

32. The memory of claim 28, wherein said input transistors are P-channel field-effect transistors.

33. The memory of claim 28, wherein said first power supply connection carries a positive power supply voltage, and said second power supply connection is a ground connection.

34. The memory of claim 28, wherein said load transistors are natural transistors.

35. The memory of claim 28, wherein said input transistors have mutually equal sizes, and said load transistors do not have mutually equal sizes.

36. The memory of claim 28, wherein said feedback transistor has the same conductivity type and threshold voltage as said load transistors.

37. The memory of claim 28, wherein said feedback transistor is connected in parallel with a first one of said load transistors, and is connected to receive a control voltage taken directly from the drain of a second one of said load transistors.

38. The memory of claim 28, wherein said feedback transistor is connected in parallel with a first one of said load transistors, and is smaller than said first load transistor, and said first load transistor is smaller than the other of said load transistors.

39. A method for performing sense amplification in a memory, comprising the steps of:
(a.) providing differential sensing inputs to the gates of first and second matched input transistors, said first input transistor being connected to provide a first output signal at a current-carrying terminal thereof;
(b.) connecting said first input transistor to a first load transistor which is connected in series therewith, and
(c.) connecting said second input transistor both to a second load transistor which is connected in series therewith and also to a feedback transistor which is directly connected to be driven by said first output signal; and
(d.) amplifying said first output signal to drive an output terminal; wherein said first input transistor is not directly connected to a power source or ground.

40. The method of claim 39, wherein said input transistors are matched.

41. The method of claim 39, wherein said input transistors are P-channel field-effect transistors.

42. The method of claim 31, wherein said first and second input transistors have respective sources thereof operatively connected to a first power supply connection; and said first and second load transistors have respective sources thereof connected to a second power supply connection; wherein said first power supply connection carries a positive power supply voltage, and said second power supply connection is a ground connection.

43. The method of claim 39, wherein said load transistors are natural transistors.

44. The method of claim 39, wherein said input transistors have mutually equal sizes, and said load transistors do not have mutually equal sizes.

45. The method of claim 39, wherein said feedback transistor has the same conductivity type and threshold voltage as said load transistors.

46. The method of claim 39, wherein said feedback transistor is connected in parallel with a first one of said load transistors, and is connected to receive a control voltage taken directly from the drain of a second one of said load transistors.

47. The method of claim 39, wherein said feedback transistor is connected in parallel with a first one of said load transistors, and is smaller than said first load transistor, and said first load transistor is smaller than the other of said load transistors.

* * * * *